US010453646B2

(12) United States Patent
Alvis et al.

(10) Patent No.: US 10,453,646 B2
(45) Date of Patent: Oct. 22, 2019

(54) TOMOGRAPHY-ASSISTED TEM PREP WITH REQUESTED INTERVENTION AUTOMATION WORKFLOW

(71) Applicant: FEI Company, Hillsboro, OR (US)

(72) Inventors: Roger Louis Alvis, Beaverton, OR (US); Trevan R. Landin, Warren, OR (US); Greg Clark, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/057,402

(22) Filed: Aug. 7, 2018

(65) Prior Publication Data
US 2019/0139735 A1 May 9, 2019

Related U.S. Application Data

(60) Provisional application No. 62/555,036, filed on Sep. 6, 2017.

(51) Int. Cl.
H01J 37/20 (2006.01)
H01J 37/31 (2006.01)
H01J 37/28 (2006.01)
H01J 37/22 (2006.01)

(52) U.S. Cl.
CPC ............ H01J 37/20 (2013.01); H01J 37/222 (2013.01); H01J 37/28 (2013.01); H01J 37/31 (2013.01); H01J 2237/20285 (2013.01); H01J 2237/2802 (2013.01); H01J 2237/2815 (2013.01); H01J 2237/31745 (2013.01); H01J 2237/31747 (2013.01); H01J 2237/31749 (2013.01)

(58) Field of Classification Search
CPC .......... H01J 37/20; H01J 37/222; H01J 37/28; H01J 2237/2802; H01J 2237/31745
See application file for complete search history.

(56) References Cited

U.S. PATENT DOCUMENTS

| 2007/0158562 | A1* | 7/2007 | Nasser-Ghodsi | H01J 37/28 250/310 |
| 2008/0296498 | A1* | 12/2008 | Hong | H01J 37/3056 250/311 |
| 2009/0133167 | A1* | 5/2009 | Yakushevska | H01J 37/263 850/3 |
| 2013/0319849 | A1* | 12/2013 | Fuller | H01J 37/3026 204/192.34 |

OTHER PUBLICATIONS

Kubel et al. 'Recent Advances in Electron Tomography: TEM and HAADF-STEM Tomography for Materials Science and Semiconductor Applications', Oct. 2005, Microsc Microanal. 378-400 (Year: 2005).*

* cited by examiner

Primary Examiner — Eliza W Osenbaugh-Stewart

(57) ABSTRACT

Provided is a process for lamella thinning and endpointing that substitutes a series of automated small angle tilts for the motions in the conventional endpointing sequence. STEM images or through-surface BSE scans are acquired at each tilt. The results are analyzed automatically to determine feature depths, and an intervention request is made requesting a user decision based on marked-up images and summary information displayed.

15 Claims, 8 Drawing Sheets

TOMOGRAPHY-ASSISTED TEM PREP WITH REQUESTED INTERVENTION AUTOMATION WORKFLOW

The present application claims priority from US Provisional Patent Application No. 62/555,036, filed Sep. 6, 2017, which is hereby incorporated by reference.

TECHNICAL FIELD OF THE INVENTION

The present invention relates to charged particle processing and in particular to a technique for automating a charged particle beam sample lamella preparation process with a dual-beam type system.

BACKGROUND OF THE INVENTION

As semiconductor and nanotechnology produces smaller and smaller circuits and other elements, it becomes more difficult to produce and manipulate the nanometer scale objects. While it is known that it is desirable to automate nano-processes, the difficult in measuring those processes makes automation difficult, if not impossible for many processes.

Analysis and measurement of samples is typically performed with a sample lamella cut from a larger semiconductor device with an ion beam, such as the process depicted in FIG. 1. As shown, an ion beam column 102 is used to project an ion beam 104 to cut a sample lamella 110 from a larger semiconductor device 108, moving the sample device with a tilt stage 106. A protective layer may be deposited over the region of interest inside the lamella 110 to protect it from ion implantation. The workpiece lamella must then the thinned to a precise thickness with the desired region of interest, containing features of interest to be examined, placed at a desired location within the finished lamella.

The thinning process is made difficult because the line widths of features achievable in semiconductor processing are significantly less than 100 nm. To control critical processes during fabrication, it is necessary to observe and measure the results of those processes. Scanning electron microscopes (SEM) are used to observe microscopic features, but as the feature size of fabricated structures decreases, the resolution of SEM is insufficient, and it is necessary to observe defects on a transmission electron microscope (TEM). While a SEM can observe a feature on or near the surface of a thick work piece, to observe a sample on a TEM, it needs to be thinned to less than 100 nm so that electrons will travel through the sample. It can be exceedingly difficult to thin a sample to less than 100 nm while ensuring that the feature that requires observation remains in the sample and is not milled away in the thinning process.

An operator will typically observe the sample as it is being thinned, stopping regularly to observe the sample to see whether or not the feature is exposed for observation. When the feature to be observed is exposed on the surface, then thinning is stopped. This process is known as end-pointing, and can be very time consuming and labor intensive. Moreover, the results are inconsistent from operator to operator because the decision of when to stop is subjective.

U.S. Pat. Pub. 2010243889 of Farber et al. describes a method of end-pointing when forming a lamella for viewing on a transmission electron microscope. In accordance with Farber, secondary particles are collected as the ion beam thins the lamella, and the image formed from the secondary particles is used to form a rough image of the cross section. The image is rough because the ion beam impacts the lamella at a glancing angle, and because the secondary particles from deep in the trench are not detected as well as the secondary particles from higher up in the trench.

There are other known methods of end-pointing a lamella being prepared for viewing on a transmission electron microscope. A process for forming a lamella is described, for example, in U.S. Publication No. 2016/0126060, filed May 21, 2012, for "Preparation of Lamellae for TEM Viewing" which is assigned to the assignee of the present invention and is hereby incorporated by reference. In that process, thinning is performed by the ion beam, using either a fiducial or an edge of the lamella itself as a reference to determine the placement of the beam for the final cut. This beam placement is not sufficiently accurate in some cases to stop the milling at the desired location, which may be determined by the exposure of a feature in the face of the cross section, rather than by a thickness of the cross section. The process uses SEM images and performs image recognition software for gross determination of the end-point, and then uses a dimension determined using edge recognition for fine end-pointing. Edge recognition is simpler than image recognition and looks at the contrast of the pixels in an image and determines an edge by a change in contrast. A smoothing function is typically applied to produce a smooth curve corresponding to the edge. After edges are recognized, geometric relationships between the edges, such as distances or angles, are determined and used to evaluate the image to determine when to stop milling. The process provides a closed loop feedback, in which after, one or more fine mill steps, the dimension is checked to determine whether or not to cease milling.

In these known processes, the repeated sample re-positioning and the relatively low signal provided by low-kV SEM images make the end-pointing very slow. Most processes also requires an expert dual-beam operator. Especially for very small features such as the features of state-of-the-art FinFET transistor devices, a very thin lamella of approximately 20 nm thickness is required to isolate the feature of interest for TEM examination. Many repeated steps are often required to produce such a lamella, including thinning the workpiece lamella in very small steps and frequently flipping the workpiece lamella to thin the opposite side. Often, the lamella is required to be removed and placed in a TEM device for a high resolution scan in order to make decisions for the endpointing process, such as which side of the workpiece lamella to mill and how thick of a layer to mill away.

What is needed are ways to improve the endpointing process that speed up the process. What is also needed are ways to perform endpointing that do not require scans in a separate TEM device. Also, ways to further automate the end-pointing process are needed. Finally, processes that can be performed with less skilled operators are needed due to the high cost of using highly skilled operators for these long and tedious processes.

SUMMARY OF THE INVENTION

An object of the invention is to facilitate automation of charged particle beam, nanoscale processes. Another object is to improve the endpointing process that speed up the process, and to perform endpointing that does not require scans in a separate TEM device. Yet another object is to provide endpointing processes that can be performed with less skilled operators are needed due to the high cost of using highly skilled operators for these long and tedious processes.

In order to achieve these objects, provided are processes for lamella thinning and endpointing that substitutes a series of automated small angle tilts for the motions in the conventional endpointing sequence. STEM images or through-surface BSE scans are acquired at each tilt. The results are analyzed automatically to determine feature depths, and an intervention request is made requesting a user decision based on marked-up images and summary information displayed.

According to a first aspect of the invention, a process is provided for preparing a site specific ultra-thin sample lamella with a focused ion beam and scanning electron microscope (FIB-SEM) dual-beam system including one or more electronic controllers and tangible, non-transitory computer readable memory coupled to the one or more electronic controllers containing program code executable by the one or more electronic controllers for performing the automated steps of the process. The process includes mounting a workpiece lamella having two opposing major lateral sides to a movable sample mount and positioning the movable sample mount within a chamber of the dual beam system. Then, under automatic control of at least one of the controllers, the process includes directing an ion beam toward the mounted workpiece lamella to mill away a layer of material from one of the major lateral sides of the workpiece. Also automatically, the process includes tilting the workpiece lamella within the chamber in a pre-designated small-angle tilt series and at each respective tilt orientation of the tilt series acquiring a STEM projection using the SEM of the dual-beam system, the tilt series of sufficient size to create a tomographic reconstruction capable of identifying feature depths. After this, the process includes automatically calculating a tomographic reconstruction of the acquired projections and identifying one or more selected features in the tomographic reconstruction and automatically applying metrology to determine respective depths of the features from both major lateral sides and preparing images of selected ones of the acquired stem projections, or tomographic image projections based on the tomographic reconstruction, with measured depths displayed and identified with boundary lines on images. The process also automatically measures the thickness of the workpiece lamella between the lateral sides based on the acquired stem projections or the tomographic reconstruction.

With this acquired data, the process automatically requests an operator intervention in the process by, on a display associated with the dual beam system: (I) displaying the prepared images with measured depths displayed and identified, (II) displaying the measured thickness of the workpiece lamella; and (III) presenting a limited choice intervention menu on the display with a first option to mill away a layer on the same major lateral side of the workpiece lamella previously milled and a second option to flip the workpiece lamella and then mill away a layer on the opposing major lateral side of the workpiece lamella and alerting an operator for the requested intervention. It then receives an operator choice through limited choice intervention menu. Based on the operator choice, the process automatically either flips the lamella or presents the previously milled major lateral side of the workpiece lamella toward the ion beam, sets an ion beam strength or desired milling thickness for a subsequent milling layer to be removed, repeats the steps of milling and measuring.

According to a second aspect of the invention, a process similar to the first aspect is conducted, but rather than use STEM scans, the process employs through-surface BSE scans in a small-angle tilt series. This may be done on one or both sides of the lamella at each iteration through the process.

According to a third aspect of the invention, a process is provided for preparing a site specific ultra-thin sample lamella with a focused ion beam and scanning electron microscope (FIB-SEM) dual-beam system including one or more electronic controllers and tangible, non-transitory computer readable memory coupled to the one or more electronic controllers containing program code executable by the one or more electronic controllers for performing the automated steps of the process. The process includes mounting a workpiece lamella having two opposing major lateral sides to a movable sample mount and positioning the movable sample mount within a chamber of the dual beam system. Then it automatically directs an ion beam toward the mounted workpiece lamella to mill away a layer of material from one of the major lateral sides of the workpiece. Next is proceeds to automatically tilt the workpiece lamella within the chamber in a pre-designated small-angle tilt series and at each respective tilt orientation of the tilt series acquire a STEM projection using the SEM of the dual-beam system, the tilt series of sufficient size to identify visible feature depths for a selected set of features. After this, it automatically identifies one or more selected features in the STEM projections, applies metrology to determine respective depths of the features from at least one of the major lateral sides by identifying feature edges, measuring shift magnitudes of the feature edges, and based on the shift magnitudes calculating an estimated depth of the one or more selected features, and then prepares images of selected ones of the acquired stem projections, with measured depths displayed and identified with shift boundary lines on images. It may also measure a thickness of the workpiece lamella between the lateral sides based on the acquired stem projections and display it with the images. Then it automatically requests an operator intervention in the process by, on a display associated with the dual beam system: (I) displaying the prepared images with measured depths displayed and identified, (II) displaying the measured thickness of the workpiece lamella; and (III) presenting a limited choice intervention menu on the display with a first option to mill away a layer on the same major lateral side of the workpiece lamella previously milled and a second option to flip the workpiece lamella and then mill away a layer on the opposing major lateral side of the workpiece lamella and alerts an operator for the requested intervention. Then the process includes receiving an operator choice through limited choice intervention menu and based on the operator choice, either flipping the lamella or presenting the previously milled major lateral side of the workpiece lamella toward the ion beam, setting an ion beam strength or desired milling thickness for a subsequent milling layer to be removed, and repeating the milling and measurement steps.

According to other aspects of the invention, the invention may be embodied as program code stored on a tangible, non-transitory memory device executable by a processor to perform the processes of the various aspects of the invention. The invention may also include a dual beam system programmed with such program code.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

The systems, processes, and program products herein provide a streamlined 'end-pointing' sequence for preparing a site-specific ultra-thin S/TEM specimen from a volume of material containing microstructures on a length-scale ranging from one nanometer to one hundred nanometers.

Conventionally, end-pointing based on features in this size range relies on iterative rotations and 'flips' of the specimen, followed by low-kV SEM imaging. In this fashion, it is possible to determine which side of the specimen should be FIB milled to ensure that the feature of interest is well centered in the lamella and that the lamella is thin enough to contain only that feature of interest. As a result of the repeated sample re-positioning and the relatively low signal provided by low-kV SEM images, end-pointing is a slow process that requires an expert dualbeam operator. Provided herein are techniques to largely automate the lamella enpointing process, referred to as automated end-pointing, by employing a workflow process in which operator intervention is requested as rarely as possible, and the analytical effort required from the operator is minimized by novel tomographic techniques, data analysis, presentation, and limited choice intervention menus as further described below.

Figure 1:
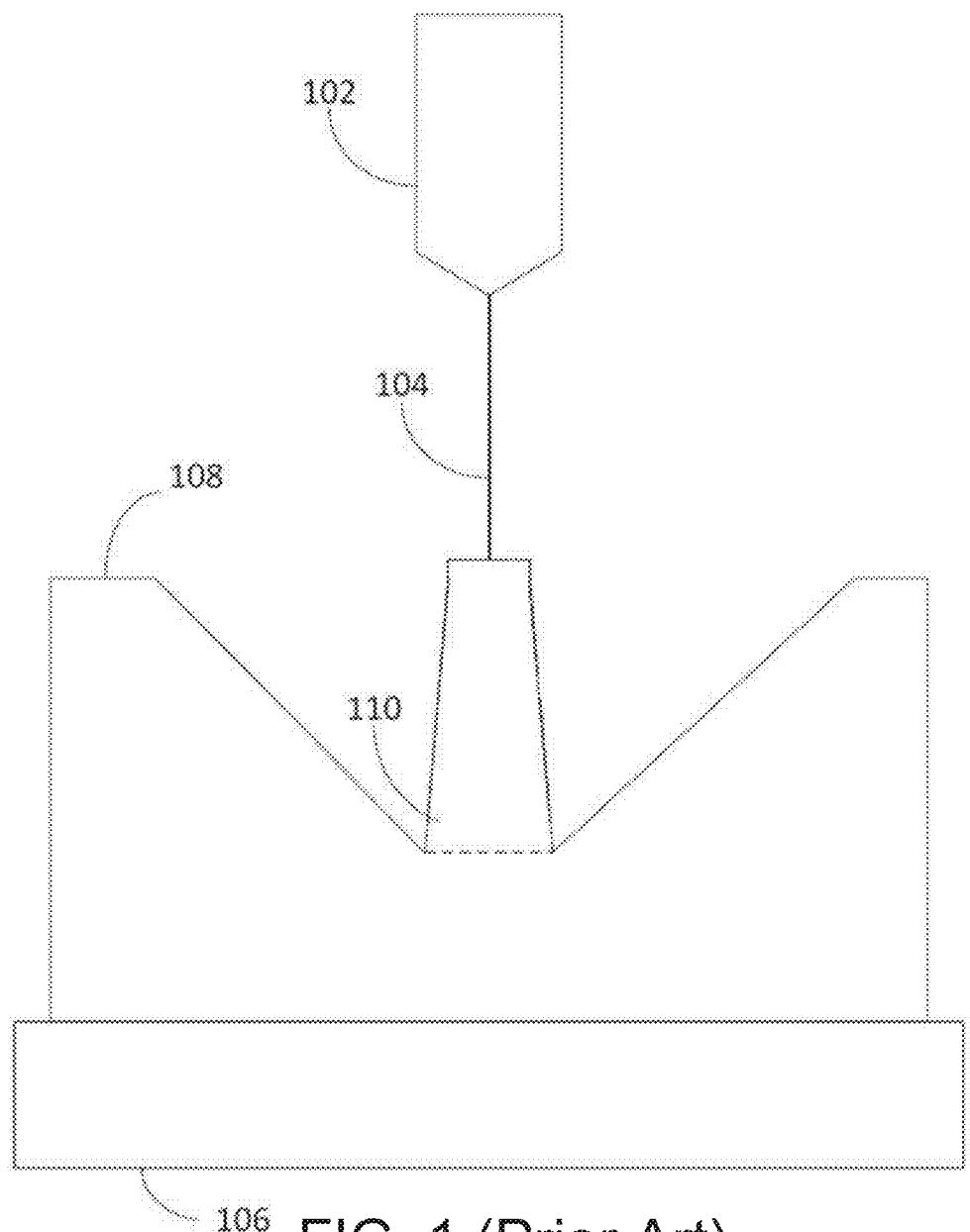
FIG. 1 shows a cross section diagram of a prior art process of creating bulk lamella from a larger sample.
Figure 2:
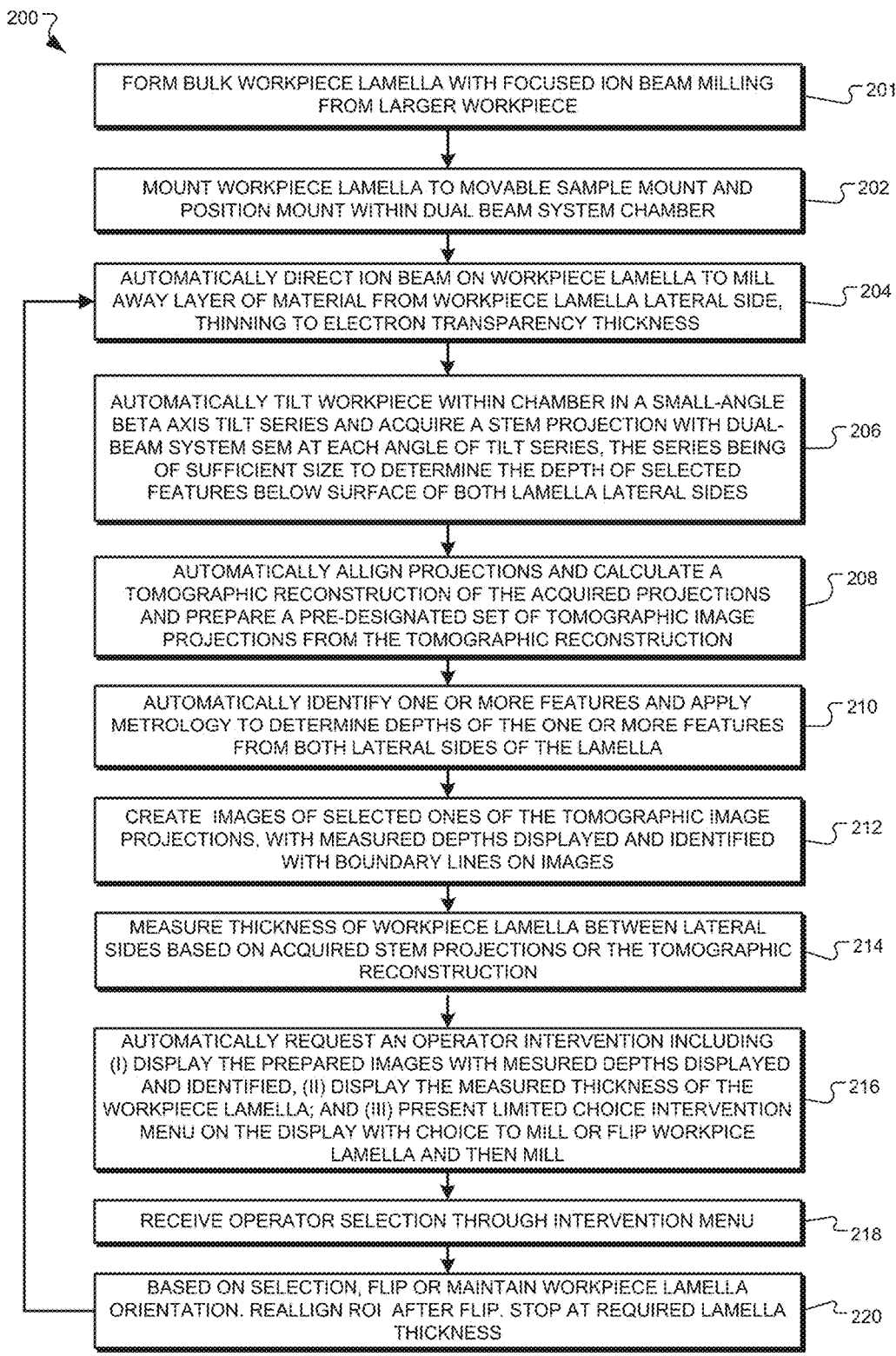
FIG. 2 is a flowchart of a process for tomography-assisted TEM sample preparation with requested intervention automation workflow according to an example embodiment of the invention.

FIG. 2 is a flowchart of a process for tomography-assisted TEM preparation with requested intervention automation workflow according to an example embodiment of the invention. Generally, the end-pointing portion of process 200 ("process" or "method") is mostly or completely automated and prepares a site specific ultra-thin sample lamella with a focused ion beam and scanning electron microscope (FIB-SEM) dual-beam system. The system employed, for example, may be a dual beam system as described with regard to FIG. 3, or another suitable dual beam system, including one or more electronic controllers and tangible, non-transitory computer readable memory coupled to the one or more electronic controllers containing program code executable by the one or more electronic controllers for performing the automated steps of the process 200, or other variations of the process within the scope of this disclosure.

Typically, the process begins at the depicted block 201, which forms a workpiece lamella with focused ion beam milling of the lamella from a larger workpiece. In some versions, the workpiece lamella may be formed in another FIB system and provided to start the process. Alternatively, the workpiece lamella is formed in the same dual beam system used for preparing the lamella for TEM examination to reduce the need to switch between different machines, a time-consuming process. The rough, pre-finished workpiece lamella at this stage of the process may be formed with an automated process based on fiducial markings on the larger sample workpiece. Or, it may be formed under direction from an operator. The output of this block is a larger, pre-finished workpiece lamella, in which the exact location of features of interest desired to be examined may not be known specifically, because the features are so small relative to the variations the manufacturing and extraction process. Therefore, the final steps of preparing the lamella for detailed examination in a high-powered TEM need to carefully thin the lamella to place the region of interest at the desired location, which may be at one of the thinned surfaces, or immediately under it, or centered in the volume of the lamella between the thinned surfaces, for example. Typically. at block 201, the region containing the feature of interest is located using indicia visible on the surface of the sample by imaging the surface with an optical microscope and/or a scanning electron microscope. The process of forming the bulk workpiece lamella may be performed automatically as well, and is known in the art. A protective layer may be deposited over the top of the region of interest to protect from ion implantation or damage during milling. The bulk workpiece lamella is formed by bulk milling trenches on both sides of the region of interest to leave a region about, for example, 500 nm thick. Pattern recognition and automated metrology are (caliper software) are applied relative to a fiducial, typically without closed loop feedback, are used to accurately place mills. The pattern recognition and caliper software are sufficiently accurate to place bulk mills, but are insufficiently accurate to determine mill placement location when performing final thinning.

Next, at block 202, the process includes mounting the workpiece lamella, having two opposing major lateral sides, to a movable sample mount in a manner not obstructing access to the two lateral sides, and positioning the movable sample mount within a chamber of the dual beam system. This mount allows the workpiece lamella position to be adjusted, flipped and tilted for milling and imaging. Preferably, the sample mount is double-tilt specimen holder allowing for specimen tilt rotation around the alpha axis (the longitudinal x axis of the sample holder), and tilt rotation around a beta axis (the y axis). One such mount is known as the CompuStage™ Double-Tilt Specimen Holder sold by FEI.

During the milling process in the following steps, the lamella is made thinner with successively smaller FIB beam currents. Fabricating a lamella for viewing on a TEM typically takes between 30 minutes and 2 hours. If the ion beam mills too far into the lamella, the feature of interest can be destroyed, which not only wastes the preparation time, it also destroys a sample that may be critically important to solving a line yield fabrication problem. The term "feature" or "feature of interest" as used herein can mean not only a structure, but the arrangement of a structure in a cross section.

The thinning process begins at block 204 by immediately milling away a layer of material from one or both lateral sides of the lamella, to thin the lamella to the point of electron transparency at the desired operating voltage of the system TEM. This is done by milling to within 50-75 nm of the expected location of the feature of interest on each major lateral side of the workpiece lamella (the exact location is unknown due to the variations possible at this extremely small scale). For example, electron transparency is less than approximately 100 nm-150 nm for a 30 keV electron beam. The milling process for thinning the workpiece lamella is typically performed using "box mill" technique in which the ion beam is raster or serpentine scanned left to right to form a line, then advanced forward. After the area (the box, in this case the lateral side of the lamella) is complete, the beam is returned to the start of the pattern (lower left corner) and the mill pattern is repeated. This rescanning of pattern occurs multiple times and is critical to cleaning the face of the lamella and minimizing mill artifacts (e.g., redeposition). A preferred version performs the milling with the specimen oriented at 52° alpha tilt and 0° beta tilt. Varying FIB beam voltages, typically 30 KeV or less, may be used for milling depending on how large the workpiece lamella is initially.

Next, at block 206, conducted under automatic control of at least one of the controllers, the process orients the sample with the previously milled face at zero tilt in both axes. The STEM detector 362 (FIG. 3) may be moved into place beneath the sample at this point if it is not already in place. The process then tilts the workpiece lamella within the chamber in a pre-designated small-angle tilt series and at each respective tilt orientation of the tilt series acquires a STEM projection using the SEM of the dual-beam system. The term "small-angle tilt series refers to a series of tomography projections in which the total angle of tilt throughout the whole series much less than a typical tomographic tilt series. For example, typical computed tomography tilts a sample many times acquiring a large series of projections across a total tilt range of 180 degrees or 360 degrees, acquiring projections at designated intervals such as 1 degree, 2 degrees, or 5 degrees. A small angle tilt series has a much smaller total range of tilt, such as 25 degrees or 15 degrees, extending symmetrically in the positive and negative tilt directions, and has much fewer projections acquired, such as 5, 7, 9, 11, or 13 total projections rather than 60, 180, or 360 projections that may be found in a normal tomographic tilt series. Any number less than around 25 projections may be used for a small angle tilt series in various versions. The tilt series is preferably conducted tilting along the beta axis of the sample holder, and preferably includes a zero degree projection and then tilts at symmetric negative and positive angles away from zero, such as +5 and −5 degrees, +10 and −10 degrees, etc. Two different small angle tilt series may also be taken, with one tilting on the beta axis and one tilting on the alpha axis.

The tilt series should be of sufficient size (number of projections) to create a tomographic reconstruction capable of identifying feature depths, but in order to speed the process the tilt series typically will not have sufficient size to create a tomographic reconstruction capable of identifying feature details or create a high-resolution reconstruction of the features in the workpiece lamella at the maximum resolution achievable for such a reconstruction on the dual beam system. The voxel size of the reconstruction for such "skinny tomography" may therefore be larger than that in a typical TEM high-resolution scan, for example 4×, 8×, or 16× larger than present high resolutions scans for lamella endpointing. The present inventors have called this process "skinny tomography", due to the relatively tiny amount of data acquired for a specific, limited purpose rather than to characterize and analyze the entire structure as is done in a typical tomographic reconstruction analysis. A skinny tomography tilt-series differs largely from conventional tomography tilt series in that the output is a much lower fidelity rendering of the microstructure contained within the lamella. Conventional tomographic tilt series are acquired to deduce in the reconstruction both relative position of features as well as their shape. Skinny tomography assumes that the process has an a-priori knowledge of the shape of the feature, sufficient to identify that feature in projection. This information is obtained from design data and/or previous measurement data and is accessed by the process at block 210 for comparison to the tomographic reconstruction to identify features and determine their depth and position. In this process, tomography is used entirely to discern the position of a feature interest (possibly relative to positions of surrounding features) and to optimize the sample preparation process. Such optimization provides several advantages, including minimizing milling steps, minimizing the number of 180° sample rotations that occur when the workpiece is flipped at block 220 (also minimizing the required re-alignment of features of interest after each flip), and minimizing workpiece handling and transfer between instruments. At least 2× productivity is gained, both through improved sample preparation yield and throughput.

In some embodiments, acquiring the STEM projections for the tilt-series using the SEM of the dual-beam system may include acquiring High Angle Annular Dark Field (HAADF) STEM images. Further, in some embodiments, acquiring the STEM projections using the SEM of the dual-beam system may include acquiring bright-field (BF) STEM images, or acquiring both HAADF and BF images.

After performing block 206, the process at block 208 automatically with of at least one of the controllers calculates a tomographic reconstruction of the acquired projections and then automatically prepares a pre-designated set of tomographic image projections from the tomographic reconstructions. The tomographic reconstruction begins with an alignment of the tilt-series images and then reconstruct the approximate lamella microstructure. Many suitable alignment algorithms exist in the field of tomography. The process is able to use a fast alignment algorithm since it disregards the fidelity of the reconstruction, not requiring high resolution data in the reconstruction. The set of tomographic projections is typically chosen when designing the process to provide beneficial views for an operator to make quick decisions when an operator intervention is required later (block 216). For example, the one version creates three projections at angles of zero degrees (flat), and + and −45 degrees. Another creates projections at zero, 45, and 90. Many other combinations may be used for the displayed projections. This is not limiting, and many other variations may produce one or more suitable images to assist operators in their decision, as described below.

Using the tomographic reconstruction, the process at block 210, automatically with of at least one of the controllers, identifies one or more selected features in the tomographic reconstruction. This is done using known techniques for analyzing tomographic data, and may include comparing to expected feature data from a CAD database or other design data containing expected sizes, shapes, relative locations, and other characteristics of the features (feature data 417, FIG. 4). For example, this block may include identifying pre-determined features by extracting features in the tomographic reconstruction with 3D analysis or image processing, and identifying the extracted features based on expected feature dimension data and automated metrology on the extracted features.

The identified features will typically include the feature of interest, and may also include surrounding features or selected features that are desired to be near or right at the lateral walls in the final lamella after milling is complete. With the selected features identified in the tomographic reconstruction, the process automatically applies metrology to the reconstruction to determine respective depths of the features from both major lateral sides. Extract an approximate thickness of the lamella and assign key features a relative position within and throughout the thickness of the lamella Then at block 212 the process prepares images of selected ones of the acquired stem projections, or the tomographic image projections discussed above, adding annotations to the images to show the measured features displayed and identified with boundary lines on images.

Next, at block 214, the process may, again automatically with of at least one of the controllers, measure a thickness of the workpiece lamella between the lateral sides based on the acquired stem projections or the tomographic reconstruction. The tomographic reconstruction is preferred for measuring the thickness, even though it will typically include so few STEM projections used to make the reconstruction that the measurement may not be as exact as it could be, it provides a good estimate. The current thickness is an important data point for determining when to stop milling the lamella or which side to continue milling.

With all the preceding data collected automatically, analyzed, and presented, the process next at block 216 automatically with of at least one of the controllers, requesting an operator intervention in the process by, on a display associated with the dual beam system: (i) displaying the prepared images with measured depths displayed and identified, (ii) displaying the measured thickness of the workpiece lamella; and (iii) presenting a limited choice intervention menu on the display with a first option to mill away a layer on the same major lateral side of the workpiece lamella previously milled and a second option to flip the workpiece lamella and then mill away a layer on the opposing major lateral side of the workpiece lamella. The process may include alerting an operator for the requested intervention, such as by beeping, flashing a notice on the screen, texting or emailing a contact stored for the operator, paging the operator on a factory paging system, or entering a notification over a network for another display designated for such purposes, for example. Such notifications allow an operator to work on other machines or work in an office while the dual beam system conducts most of the required milling, data gathering, and analysis automatically, and then return to the dual beam system or login to see the dual beam data display remotely when the operator intervention request is made.

The operator can then view the images and data prepared for their analysis and make a decision quickly as to which side to mill next. This decision is entered at block 218 where the process includes receiving an operator choice through limited choice intervention menu. The process also helps provide economic savings by allowing for lower skilled operators to make the decision based on the prepared summarized data rather than reviewing all of the acquired projections and design data regarding the feature of interest and the surrounding features. In fact, operators who may not be trained all the techniques of milling and imaging analysis may make such determinations using the systems and methods described herein.

In response, at block 220, the process based on the operator choice, either flips the lamella to present the opposite lateral side from that previously milled to the ion beam for milling, or positions the workpiece lamella presenting the previously milled lateral side of the workpiece lamella toward the ion beam, setting an ion beam strength or desired milling thickness for a subsequent milling layer to be removed. It then returns to the milling step at block 204 to repeat the process until milling is complete and the lamella has the desired final thickness with the feature of interest at the desired location within the lamella volume. The sample is then ready for high-resolution analysis with a TEM system.

As discussed above, the process may also include ion beam milling the workpiece lamella from a larger workpiece under automatic control of the one or more controllers.

Figure 3:
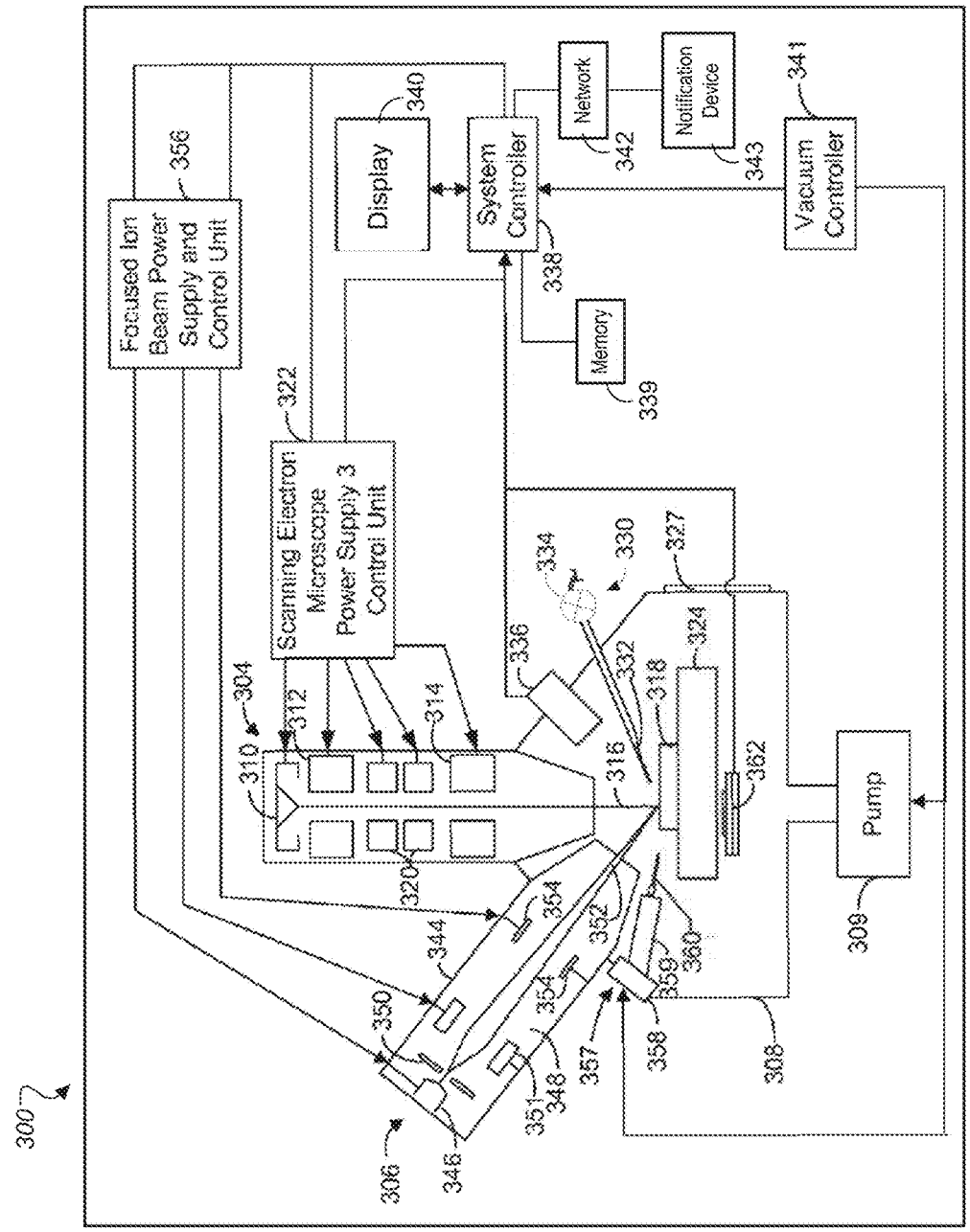
FIG. 3 is a schematic diagram of a one embodiment of an exemplary dual beam SEM/FIB system that is equipped to carry out automated end-pointing processes according to the present invention.

FIG. 3 is a schematic diagram of a one embodiment of an exemplary dual beam SEM/FIB system 300 that is equipped to carry out methods according to the present invention. Suitable dual beam systems are commercially available, for example, from FBI Company, Hillsboro, Oreg., the assignee of the present application. While an example of suitable hardware is provided below, the invention is not limited to being implemented with any particular dual-beam device. The system controller 338 controls the operations of the various parts of dual beam system 300. Through system controller 338, a user can cause ion beam 352 or electron beam 316 to be scanned in a desired manner through commands entered into a conventional user interface (not shown) or through automated program code stored in tangible, non-transitory memory such as a flash drive or hard drive coupled to the system controller. In the preferred embodiments herein, system controller 338 controls dual beam system 300 to perform the techniques discussed herein automatically or under control of technicians in accordance with programmed instructions. System controller is also preferably connected to a network 342 over which it is operable to send operator notifications, either directly or indirectly, to a notification device 343 associated with an operator, to provide notification of the operator intervention requests as described herein.

Dual beam system 300 has a vertically mounted electron beam column 304 and a focused ion beam (FIB) column 306 mounted at an angle of approximately 52 degrees from the vertical on an evacuable sample chamber 308. The sample chamber may be evacuated by pump system 309, which typically includes one or more, or a combination of, a turbo-molecular pump, oil diffusion pumps, ion getter pumps, scroll pumps, or other known pumping means.

The electron beam column 304 includes an electron source 310, such as a Schottky emitter or a cold field emitter, for producing electrons, and electron-optical lenses 312 and 314 forming a finely focused beam of electrons 316. Electron source 310 is typically maintained at an electrical potential of between 500 V and 30 kV above the electrical potential of a workpiece lamella 318, which is typically maintained at ground potential. Thus, electrons impact the workpiece lamella 318 at landing energies of approximately 500 eV to 30 keV. A negative electrical potential can be applied to the work piece to reduce the landing energy of the electrons, which reduces the interaction volume of the electrons with the work piece surface, thereby reducing the size of the nucleation site. Work piece 318 may, a semiconductor device or micro-electromechanical system (MEMS), or samples taken therefrom, for example. The impact point of the beam of electrons 316 can be positioned on and scanned over the surface of a workpiece lamella 318 by means of deflection coils 320. Operation of lenses 312 and 314 and deflection coils 320 is controlled by scanning electron microscope power supply and control unit 322. Lenses and deflection unit may use electric fields, magnetic fields, or a combination thereof.

Workpiece lamella 318 is mounted to movable stage or tilt sample holder 324 within sample chamber 308. Holder 324 can preferably move in a horizontal plane (X and Y axes) and vertically (Z axis) and can tilt approximately sixty (60) degrees and rotate about the Z axis. Preferably, the sample holder 324 is double-tilt specimen holder allowing for specimen tilt rotation around the alpha axis (the longitudinal x axis of the sample holder), and tilt rotation around a beta axis (the y axis). One such mount is known as the CompuStage™ Double-Tilt Specimen Holder sold by FEI. A door 327 can be opened for inserting workpiece lamella 318 sample holder, and also for servicing an internal gas supply reservoir (not shown), if one is used. The door is interlocked so that it cannot be opened if sample chamber 308 is evacuated. Optionally mounted on the vacuum chamber are multiple gas injection systems (GIS) 330. Each GIS comprises a reservoir (not shown) for holding the process gasses or imaging gasses that may be employed with the system, and a needle 332 for directing the gas to the surface of the work piece. A regulator 334 regulates the supply of gasses to the work piece.

When the electrons in the electron beam 316 strike workpiece lamella 318, secondary electrons, backscattered electrons, and Auger electrons are emitted and can be detected to form an image or to determine information about the work piece. Secondary electrons, for example, are detected by backscattered electron or secondary electron detector 336 ("BSE/SE detector"), such as an Everhart-Thornley detector, or a semiconductor detector device capable of detecting low energy electrons. STEM detector 362, located beneath the TEM sample holder 318 and the holder 324, can collect electrons that are transmitted through a sample 318 mounted on the TEM sample holder 318. Signals from the detectors 336, 362 are provided to a system controller 338. Said controller 338 also controls the deflector signals, lenses, electron source, GIS, stage and pump, and other items of the instrument, typically through signal generation circuitry coupled to a data bus at the system controller. Display 340 is used to display user controls and images of the work piece using the received signals, as well as tomographic images and analysis based on the received data.

The chamber 308 is evacuated by pump system 309 under the control of vacuum controller 341. The vacuum system provides within chamber 308 a vacuum of approximately 3×10−6 mbar. Focused ion beam column 306 comprises an upper neck portion 344 within which are located an ion source 346 and a focusing column 348 including extractor electrode 350 and an electrostatic optical system including an objective lens 351. Ion source 346 may comprise a liquid metal gallium ion source, a plasma ion source, a liquid metal alloy source, or any other type of ion source. The axis of focusing column 348 is tilted 52 degrees from the axis of the electron column. An ion beam 352 passes from ion source 346 through focusing column 348 and between electrostatic deflectors 354 toward workpiece lamella 318.

FIB power supply and control unit 356 provides an electrical potential at ion source 346. Ion source 346 is typically maintained at an electrical potential of between 1 kV and 60 kV above the electrical potential of the work piece, which is typically maintained at ground potential. Thus, ions impact the work piece at landing energies of approximately 1 keV to 60 keV. FIB power supply and control unit 356 is coupled to deflection plates 354 which can cause the ion beam to trace out a corresponding pattern on the upper surface of the work piece. In some systems, the deflection plates are placed before the final lens, as is well known in the art. Beam blanking electrodes (not shown) within ion beam focusing column 348 cause ion beam 352 to impact onto blanking aperture (not shown) instead of workpiece lamella 318 when a FIB power supply and control unit 356 applies a blanking voltage to the blanking electrode.

The ion source 346 typically provides a beam of singly charged positive gallium ions that can be focused into a sub 100 nm wide beam at workpiece lamella 318 for modifying the workpiece lamella 318 by ion milling, enhanced etch, material deposition, or for imaging the workpiece lamella 318.

A micromanipulator 357, such as the AutoProbe200™ from Omniprobe, Inc., Dallas, Tex., or the Model MM3A from Kleindiek Nanotechnik, Reutlingen, Germany, is mounted within the chamber and coupled to be controlled from the system controller 338 for precisely moving objects within the vacuum chamber. Micromanipulator 357 may comprise precision electric motors 358 positioned outside the vacuum chamber to provide X, Y, Z, and theta control of a portion 359 positioned within the vacuum chamber. The micromanipulator 357 can be fitted with different end effectors such as thin probe 360.

It should be noted that FIG. 3 is a schematic representation, which does not include all the elements of a typical dual beam system for the sake of simplicity, and which does not reflect the actual appearance and size of, or the relationship between, all the elements.

System controller 338 controls the operations of the various parts of dual beam system 300. System controller 338 controls dual beam system 300 in accordance with user instructions or programmed instructions stored in a memory 339. In some embodiments, dual beam system 300 incorporates image recognition software, such as software commercially available from Cognex Corporation, Natick, Mass., to automatically identify regions of interest, and then the system can manually or automatically extract bulk workpiece lamella samples in accordance with the invention. For example, the system could automatically locate similar features on semiconductor wafers including multiple devices, and take samples of those features on different (or the same) devices.

Figure 4:
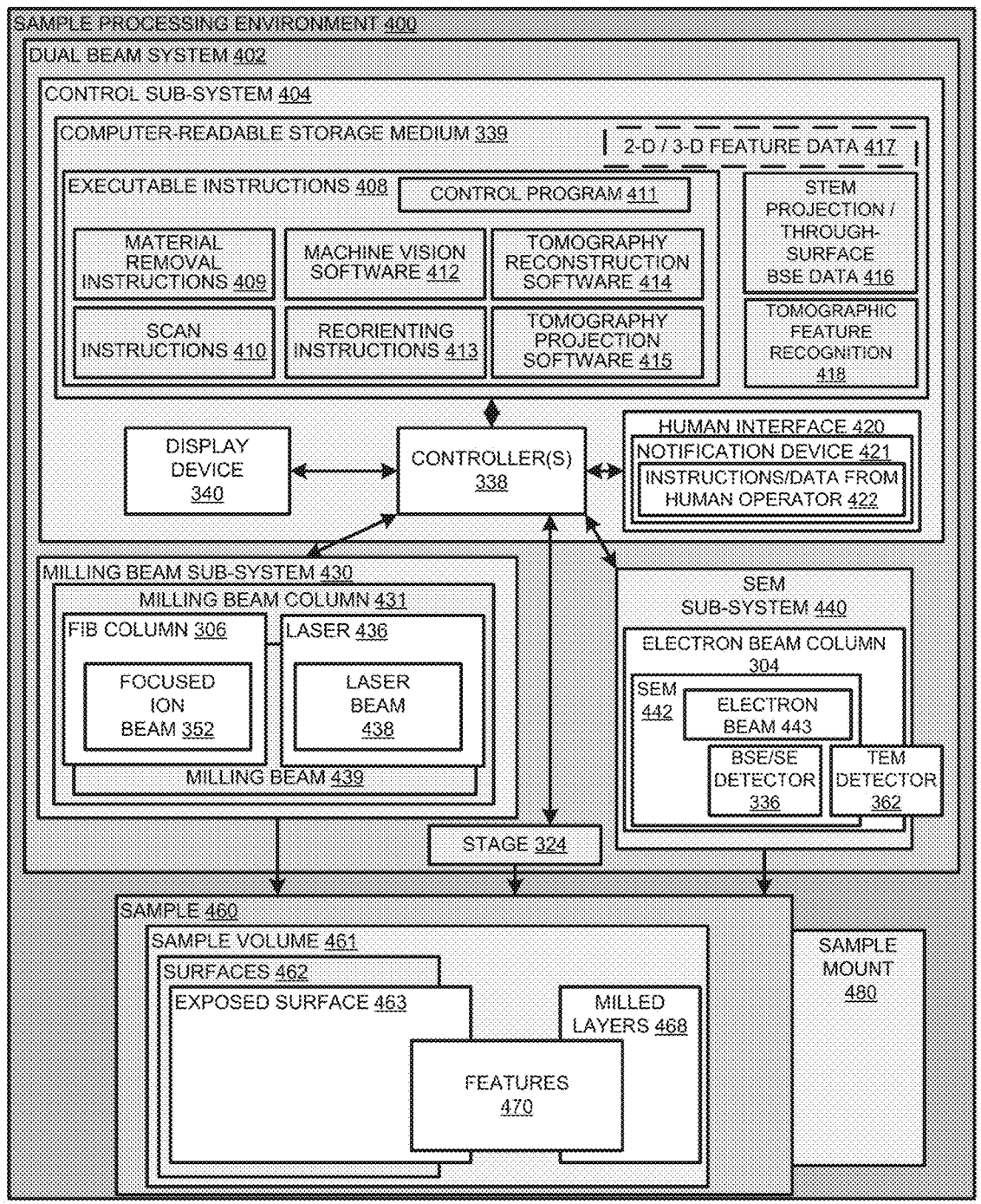
FIG. 4 shows a block diagram of an embodiment of an automated end-pointing dual charged particle beam system.

Referring now to FIG. 4, a block diagram of an embodiment of an automated end-pointing dual charged particle beam system 402 is shown. System 402 may be utilized in sample processing environment 400. Examples of sample processing environment 400 include, but are not limited to, laboratories and other experimental facilities for carrying out research and development in semiconductor technology, quality control in material manufacture, and defect testing of electronic components such as silicon wafers and other semiconductor components.

System 402 includes a control sub-system 404, a milling beam sub-system 430, an SEM sub-system 440, and a holder 324 configured to work in cooperation to carry out automated end-pointing processing of a sample such as, for example, sample 460, which is preferably a bulk workpiece lamella for processing to create a finished lamella suitable for detailed STEM analysis as described herein.

Control sub-system 404 comprises a computer-readable storage medium 339, a display device 340, human interface 420, and one or more controllers 338. Computer-readable storage medium 404 stores processor accessible information comprising executable instructions 408, images captured by SEM system 440, such as STEM images 416 captured by TEM detector 362. The memory 339 may also hold feature data 417 such as CAD or other design data with designated locations, dimensions, and materials expected for the features being examined, as well as extracted feature data concerning the examined features 412 obtained via automated end-pointing processing of sample 460 according to the techniques herein (e.g., coordinates and boundaries of features recognized from tomographic reconstructions 418). The feature data regarding expected designs may be stored elsewhere and accessed over a network. Computer-readable storage medium 339 is coupled to the one or more controllers 338 such that one or more controllers 338 can read and execute executable instructions 408, process data acquired from at least one of sub-systems 430 and 440, present menus and intervention requests to the operator through human interface 420 (and/or over a connected network) and receive input from human interface 420.

Controllers 336 also control holder 324 in accordance with executable instructions 408, direct the writing of data acquired from at least one of sub-systems 430 and 440, human interface 420, and holder 324 to computer-readable storage medium 339. Computer-readable storage medium may be a device capable of storing information for a period of time in a format readable by a computer, such as a hard drive or flash memory drive, and may be locally installed in the dual beam system 402 or, in part of in whole, installed in a storage server connected to the dual beam system 402. The storage medium 339 includes a control program 411 generally controlling the system to perform the processes and methods described herein, and other program instructions or software executable for various sub functions as described below. One or more controllers 338 also read and send information to display device 340 for viewing by a human operator and/or observer. For example, in various embodiments one or more controllers 338 access feature data 417 and/or SEM images 416 stored on computer-readable storage medium 339. In such embodiments, one or more controllers 338 also direct display device 340 to display feature data 417 and/or STEM images or through-surface BSE data 416 or tomographic projections from tomographic reconstructions 418.

Human interface 420 comprises devices 421 configured to enable human interaction with sub-systems 404, 430, 440, and 324. Human interaction with sub-systems 404, 430, 440, and 324 may include, for example, the inputting by a human operator of instructions and/or data 422 for controlling automated end-pointing processing of a sample and/or for manipulating experimental data produced therefrom. Examples of devices suitable for human interface 420 include, but are not limited to, keyboards, computer mice, touch interfaces such as tablet computers, or any combination thereof. Human interface 420 also comprises executable instructions for managing the interactions of human operators with system 402.

Display device 340 may be configured to display information from one or more of sub-systems 404, 430, 324, and holder 324. Display device 340 projects electronically generated images, which may include, for example, feature data 417 generated from the automated end-pointing processing of sample 460, STEM images 416 captured with respect to surfaces 462, feature data of curves fitted to topographies of surfaces 462, or any combination thereof. Examples of suitable display devices include, but are not limited to, LCD displays, plasma displays, cathode rays tube displays, and wall projectors.

Sample 460, typically a bulk lamella, includes a sample volume 461 containing feature(s) 470 to be positioned within the sample by removing milled layers 468 of sample volume 461, and has surfaces 462 including top, bottom, minor side surfaces, and the two major lateral side surfaces which are thinned by removal of milled layers 468. Stage or tilt holder 324 supports sample 460 during automated end-pointing processing, typically with a sample mount 480 to which the sample 324 is mounted in a manner allowing tilt, rotation, and unobstructed TEM reading to be made with TEM detector 362. In various embodiments, stage or tilt holder 324 is rotatable and configured to rotate in directions and to degrees allowing sample 462 to be imaged, or STEM projections taken, from different angles of a tilt series by SEM 443.

Milling beam sub-system 430 comprises a milling beam column 431 configured to emit a milling beam 439 under control of controllers 338 and to remove milled layers 468 by emitting milling beam 439. In some embodiments, such as that of FIG. 3, milling beam column 431 is a FIB column 306 configured to emit a focused ion beam 352. In other embodiments, milling beam column 431 is a laser 436 configured to emit laser beam 438. Still other embodiments comprise multiple milling beam columns and/or types of milling beam columns. Milling beam sub-system 430 is configured to carry out removal of material in accordance with material removal instructions 409 stored on computer-readable storage medium 339.

SEM sub-system 440 comprises SEM column 304, which is configured to emit SEM 443 to capture images of surfaces 462 of sample 460 exposed by milling beam sub-system 430, capture surface and through-surface BSE images through BSE and SE detectors 336, and capture STEM images or data through TEM detector 362. Embodiments of system 402 are not limited to a single SEM column, a single type of SEM column, or a single type of SEM.

Embodiments of automated end-pointing processing of the disclosure, such as method 300 described above, may be carried out by system 402 according to executable instructions 408 stored on computer-readable storage medium 339 of system 402. Executable instructions 408 comprise material removal instructions 409, machine vision software 412, data scanning instructions 410, reorienting instructions 413, tomography reconstruction software and analysis software 414, and tomography projection generating software 415.

Material removal instructions 409 include instructions for removing milled layers 468 to expose surfaces 462. Material removal instructions 409, when executed, cause one or more controllers 338 to direct milling beam 439 to remove milled layers 468 from sample volume 461 according to the processes described herein, the removal of each slice 469 exposing a surface 463 of surfaces 462.

For each exposed surface 463, the one or more controllers 338 direct components of system 402 to carry out one or more data scanning instructions 410. Data scanning instructions 410, when executed, cause one or more controllers 338 to direct the SEM subsystem 440 to scan the workpiece lamella with the desired form of scan, such as STEM scans in the process of FIG. 2 and FIG. 6, or through-surface BSE scans as employed with the process of FIG. 5. while SEM column 304 and exposed surface 463, thereby capturing each respective scan through the newly exposed surface 463 to complete the tilt series scan acquisition for the various processes. The tilt-series tilt movements are accomplished by changing the angle of incidence of the scanning beam (typically the SEM/STEM beam), accomplished by executing reorienting instructions 413. Executable instructions 408, when executed, cause one or more controllers 338 to carry out the data scanning instructions 410 for capturing each subsequent scan in the tilt series after an execution of reorienting instructions reorientation 413.

Figure 5:
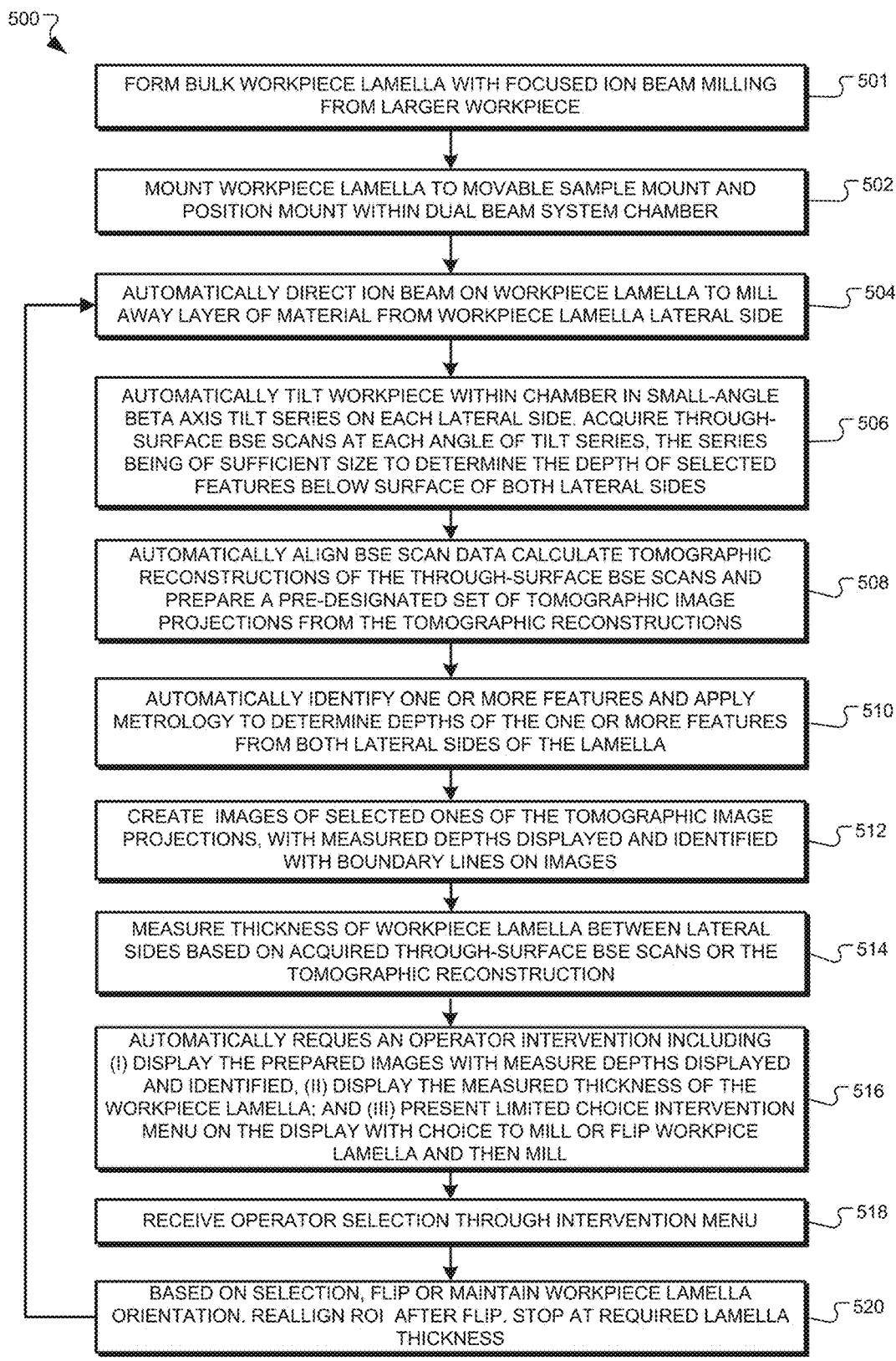
FIG. 5 is a flowchart of a process for through-surface BSE tomography-assisted TEM sample preparation with requested intervention automation workflow according to an example embodiment of the invention.

System 402 utilizes tomography reconstruction software 414 to generate the tomography reconstruction used in the process of FIG. 2 and that used in the process of FIG. 5. Tomography projection software 415 is used to generate the desired projections based on the reconstruction for the same processes. Tomographic feature recognition software 418 is employed to recognize and locate the positions and depths of features based on the tomographic reconstruction in the process of FIG. 2 and of FIG. 5, and to perform the image analysis for the same purpose in the process of FIG. 6 which does not include a tomographic reconstruction. Software 418 accesses the feature data 417 for recognizing and locating the features. The executable instructions 408 of system 402 may comprise instructions for generating feature data of feature 470 after automated end-pointing processing feature 470 according to executable instructions 408 using system 402.

In various embodiments, system 402 is configured to carry out the steps of methods as described herein. In some embodiments, system 402 is configured to coordinate the execution of executable instructions 409, 410, 412, 413, 414, and 415 (e.g., via a set of executable coordinating instructions) under direction of a control program 411.

FIG. 5 is a flowchart of a process for through-surface BSE tomography-assisted TEM sample preparation with requested intervention automation workflow according to an example embodiment of the invention. The process is similar to that of FIG. 2 through block 504, but rather than employing STEM projections to scan the workpiece lamella, this embodiment uses through-surface BSE scans of the workpiece lamella at block 506. The scans are made by scanning a pattern over the workpiece lamella surface with electron beam 443 and measuring with the BSE detector 336 (FIG. 3), with a complete scan made at each angle of a small angle tilt series. The tilt series is performed by tilting on the beta axis of the sample holder, and may also include a second tilt series tilting along the alpha axis. Each small-angle tilt series preferably includes a zero degree projection and then tilts at symmetric negative and positive angles away from zero, such as +5 and −5 degrees, +10 and −10 degrees, etc, in the beta tilt axis. In each scan, the BSE signal provides a 'through-surface' view of the workpiece lamella microstructure, with the small-angle tilts of the tilt series employed to displace the surface features relative to the sub-surface features.

Next at block 508, the process automatically calculates a tomographic reconstruction based on the through-surface BSE scans, and prepare a pre-designated set of tomographic image projections from the tomographic reconstruction. This may be done for both major lateral sides of the workpiece lamella. Similarly to the "skinny tomography" reconstruction discussed above, the process here employs data from the through-surface BSE small-angle tilt series sufficient to identify the location features beneath the surface, but preferably does not acquire and use enough data to prepare a high-resolution. The tomographic reconstruction begins with an alignment of the tilt-series images and then reconstruct the approximate lamella microstructure. Also like the process of FIG. 2, this process is able to use a fast alignment algorithm since it disregards the fidelity of the reconstruction, not requiring high resolution data in the reconstruction.

Following the tomographic reconstruction, the process prepares a set of tomographic projections, which is typically chosen when designing the process to provide beneficial views for an operator to make quick decisions when an operator intervention is required later (block 516). For example, one embodiment creates three projections, at zero degrees, +45 degrees, and −45 degrees beta tilt. This is not limiting and other setsprojections including a 70, 80, or 90 degree projection may be used.

Also using the tomographic reconstruction, the process at block 510, automatically with of at least one of the controllers, identifies one or more selected features in the tomographic reconstruction. This is done using known techniques for analyzing tomographic data, and may include comparing to expected feature data from a CAD database or other design data containing expected sizes, shapes, relative locations, and other characteristics of the features (feature data 417, FIG. 4). For example, this block may include identifying pre-determined features by extracting features in the tomographic reconstruction with 3D analysis or image processing, and identifying the extracted features based on expected feature dimension data and automated metrology on the extracted features. The identified features will typically include the feature of interest, and may also include surrounding features or selected features that are desired to be near or right at the lateral walls in the final lamella after milling is complete. With the selected features identified in the tomographic reconstruction, the process automatically applies metrology to the reconstruction to determine respective depths of the features from both major lateral sides. Extract an approximate thickness of the lamella and assign key features a relative position within and throughout the thickness of the lamella Then at block 512, the process prepares images of selected ones of the tomographic image projections discussed above, or selected one of the through-surface BSE scans, adding annotations to the images to show the measured features displayed and identified with boundary lines on images. This process may, after each flip that changes the major lateral side of the workpiece lamella being milled, prepare a two sided through surface BSE scan for display, showing the last-acquired opposite side balled imagery along with the present side labelled imagery to assist the operator in making decision of whether to flip at block 518. At block 514, the process automatically with of at least one of the controllers, estimates the thickness of the workpiece lamella between the lateral sides based on the acquired through-surface or the tomographic reconstruction.

With all the preceding data collected automatically and prepared for presentation on the displayed images, the process next at block 516 automatically with of at least one of the controllers, requests an operator intervention in the process by, on a display associated with the dual beam system: (i) displaying the prepared images with measured depths displayed and identified, (ii) displaying the measured thickness of the workpiece lamella; and (iii) presenting a limited choice intervention menu on the display with a first option to mill away a layer on the same major lateral side of the workpiece lamella previously milled and a second option to flip the workpiece lamella and then mill away a layer on the opposing major lateral side of the workpiece lamella.

The intervention request at block 516 is similar to that of block 216. After the intervention request, the operator can view the images and data prepared for their analysis, and make a decision quickly as to which side to mill next. This decision is entered at block 518 where the process includes receiving an operator choice through limited choice intervention menu. The process also helps provide economic savings by allowing for lower skilled operators to make the decision based on the prepared summarized data rather than reviewing all of the acquired projections and design data regarding the feature of interest and the surrounding features. In fact, operators who may not be trained all the techniques of milling and imaging analysis may make such determinations using the systems and methods described herein.

In response, at block 520, the process based on the operator choice, either flips the lamella to present the opposite lateral side from that previously milled to the ion beam for milling, or positions the workpiece lamella presenting the previously milled lateral side of the workpiece lamella toward the ion beam, setting an ion beam strength or desired milling thickness for a subsequent milling layer to be removed. It then returns to the milling step at block 504 to repeat the process until milling is complete and the lamella has the desired final thickness with the feature of interest at the desired location within the lamella volume. The sample is then ready for high-resolution analysis with a TEM system.

Figure 6:
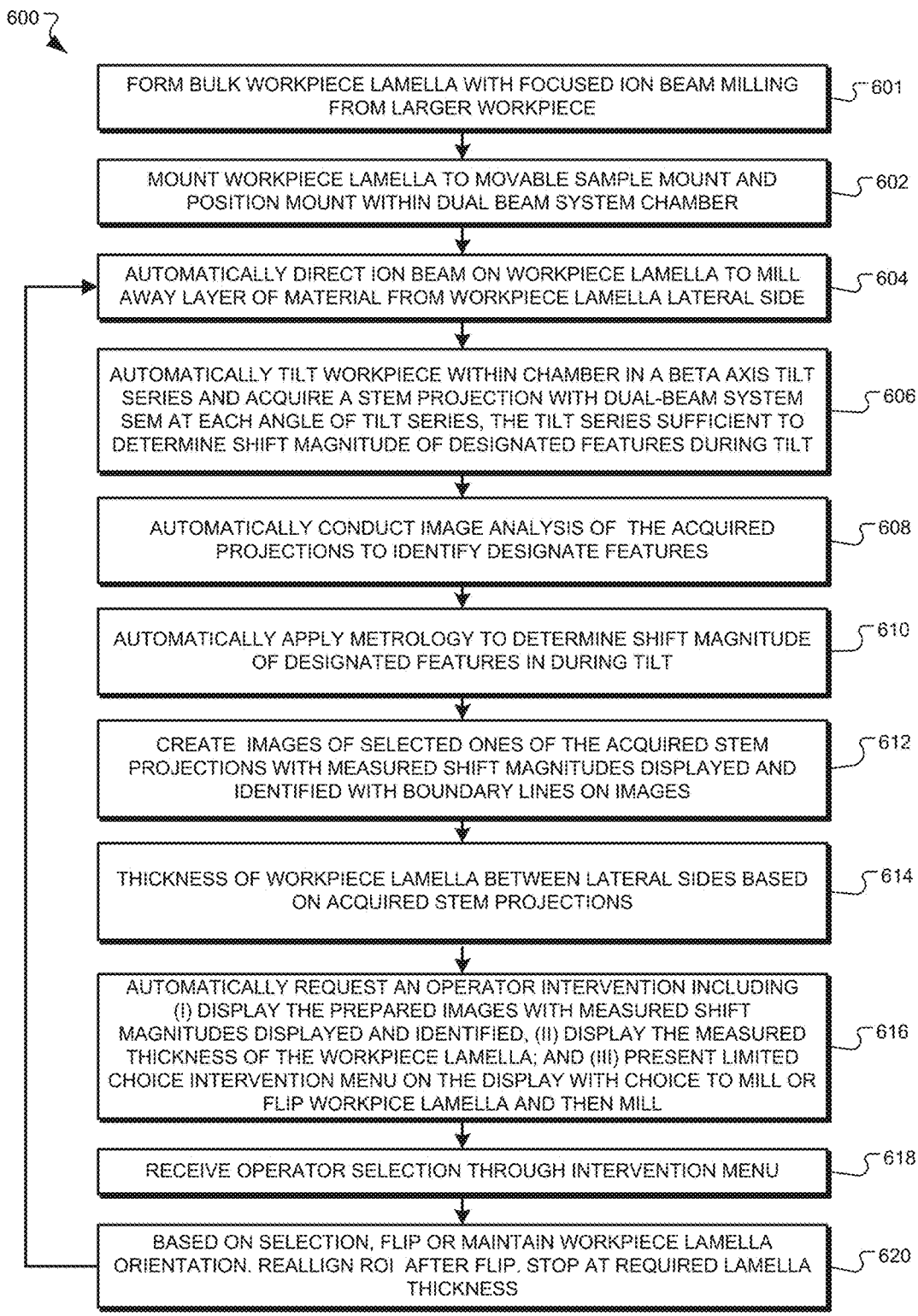
FIG. 6 is a flowchart of a process for au TEM sample preparation employing TEM projection analysis with requested intervention automation workflow according to an example embodiment of the invention.

FIG. 6 is a flowchart of a process for automatic TEM sample preparation employing TEM projection analysis with requested intervention automation workflow according to another embodiment of the invention. In this embodiment, an estimate of feature positions and depths within the workpiece lamella is created without using tomographic reconstruction, and instead employing TEM projections analyzed directly. Such a process is useful for a very thin (approximately sub-20 nm) workpiece lamella, such as, for example, a lamella containing state-of-the-art semiconductor structures (FinFET devices). The process may be used with thicker workpiece lamellas as well, however different features than the feature of interest will be recognized in the early iterations of the process because the through-surface BSE does not provide enough depth to scan to the center of a rough workpiece lamella (i.e. at the beginning of the thinning process). Process blocks 601-604 are similar to the processes of FIGS. 2 and 5, with the workpiece lamella loaded onto a sample holder or mount, and initial milling to thin the lamella at block 604. As with the other processes, the thinning at this step preferably FIB mills to about 50 nm-75 nm from the expected location of the feature of interest on each major lateral side of the lamella. The process at block 606 employs STEM image each at beta axis tilt series including tilts of 0° (no tilt) and ±5° and/or ±10° or a similar small tilt provides sufficient information (relative magnitude of shift in features) such that the alignment and reconstruction step used in other embodiments may not be required to glean which major lateral side of the workpiece lamella to continue thinning.

Figure 8A:
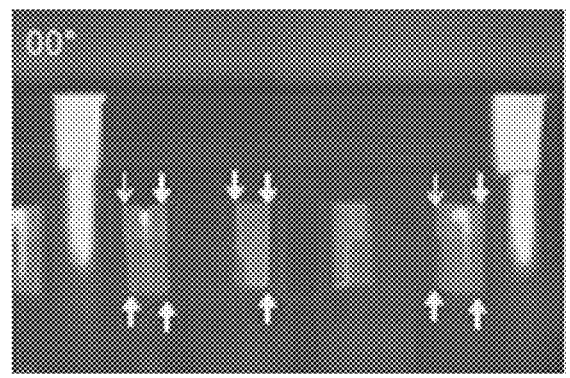
FIGS. 8A-8C are a series of example STEM projections employed with the processes herein.
Figure 8B:
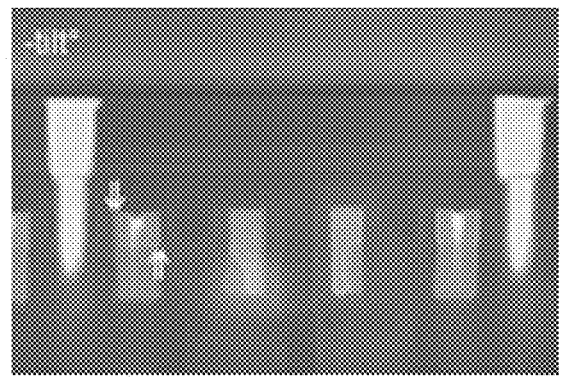
Figure 8C:
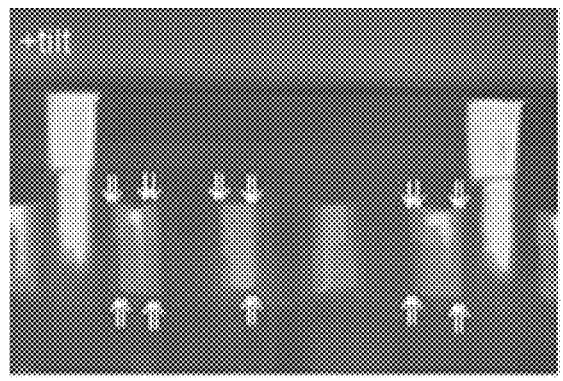

The resulting STEM images are analyzed at block 608. An example of such STEM images is shown in FIGS. 8A-8C, with the zero degree tilt image in FIG. 8A, the −10 degree tilt shown in FIG. 8B, and the +10 degree tilt shown in FIG. 8C. At block 608 the process performs image analysis to locate the edges of features, labelled with the arrows in FIGS. 8A-8C. Tilted features show a double line along the edge as the STEM beam penetrates the entire body of the feature in the more central edge, but penetrates less of the body out toward the outer tilted edge, providing a lighter image (higher signal level) along the edge, as shown labelled with the double arrows in FIGS. 8B and 8C. The distance between these detected edges is measured at block 610, using metrology on the image based on the known size and resolution of the STEM scan. The process identifies features closer to the surface as those features registering a larger shift are closer to one of the surfaces of the lamella. The direction a feature shifts relative to the physical shift accompanying the physical tilt of the lamella allows the process to determine the side of the sample that a feature is located in. Thus the direction and magnitude a feature shifts after registering provides a relative positioning, even if no features are located exactly at either surface of the lamella, enabling a process requiring fewer steps than using only surface SEM analysis. The process may identify the features based on matching with feature data 417 of features expected to be found in the region of interest.

At block 612, the process creates images like those of FIGS. 8A-8C, and adds labels showing the thickness along with the identified edges or boundary lines of identified features on the image. The thickness of the lamella may also be estimated by measuring shift along the edges, for example, at block 614, and then added to the display image as a label.

The process next at block 616 includes, automatically with of at least one of the controllers, requesting an operator intervention in the process by, on a display associated with the dual beam system: (i) displaying the prepared images with measured depths displayed and identified, (ii) displaying the measured thickness of the workpiece lamella; and (iii) presenting a limited choice intervention menu on the display with a first option to mill away a layer on the same major lateral side of the workpiece lamella previously milled and a second option to flip the workpiece lamella and then mill away a layer on the opposing major lateral side of the workpiece lamella.

The intervention request at block 616 is similar to that of block 216. After the intervention request, the operator can view the images and data prepared for their analysis, and make a decision quickly as to which side to mill next. This decision is entered at block 618 where the process includes receiving an operator choice through limited choice intervention menu. In response, at block 520, the process based on the operator choice, either flips the lamella to present the opposite lateral side from that previously milled to the ion beam for milling, or positions the workpiece lamella presenting the previously milled lateral side of the workpiece lamella toward the ion beam, setting an ion beam strength or desired milling thickness for a subsequent milling layer to be removed. It then returns to the milling step at block 504 to repeat the process until milling is complete and the lamella has the desired final thickness with the feature of interest at the desired location within the lamella volume. The sample is then ready for high-resolution analysis with a TEM system.

Figure 7A:
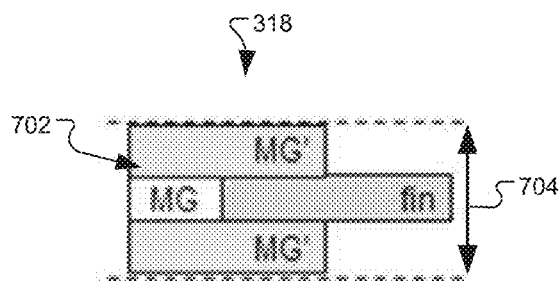
FIGS. 7A-7B are cross section diagrams of an example feature analyzed according to the process of FIG. 6.
Figure 7B:
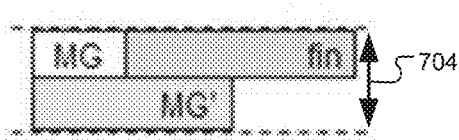

FIGS. 7A-7B are cross section diagrams of an example feature analyzed according to the process of FIG. 6. FIGS.

Figure 7C:
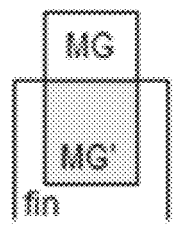
FIGS. 7C-7D are top down diagrams of an example feature analyzed according to the process of FIG. 6.
Figure 7D:
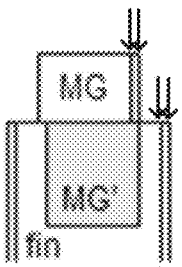

7C-7D are top down diagrams of an example feature analyzed according to the process of FIG. 6. These diagrams may apply to any of the processes described herein as the workpiece lamella thinning or endpointing process nears its end. Shown, a workpiece lamella 318 includes a FinFET device 702 which is desired to be examined. The diagram is, of course, idealized with the dotted lines representing the major lateral side of the lamella and the solid lines representing feature edges, which in practice are irregular. In FIG. 7A the workpiece lamella 318 cross section has a thickness labelled 704, with a multigate structure MG and MG' desired to be examined at the layer of the device fin. The example processes herein (FIG. 2, FIG. 5, FIG. 6) in operation detect the configuration of FIG. 7A and display an intervention request for the operator. The operator can see from the intervention request presentation that the desired milling is close to complete on the top depicted side, and select one more thinning step on the top side. After this thinning is conducted, the workpiece lamella 318 has the configuration shown in FIG. 7B with the thickness 704 reduced by the milling step. FIG. 7C shows a top down diagram which shows feature that may be observed by a top-down zero degree tilt STEM projection performed on the workpiece lamella 318 of FIG. 7B. A corresponding scan done at a positive tilt may yield a view as seen in FIG. 7D, where the lower edges of the features are displaced and can be detected by the additional edges that appear in the projection as labelled by the arrows.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, means, methods and steps described in the specification. As one of ordinary skill in the art will readily appreciate from the disclosure of the present invention, processes, machines, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, matter composition, means, methods, or steps.

We claim as follows:

1. A process for preparing a site specific ultra-thin sample lamella with a focused ion beam and scanning electron microscope (FIB-SEM) dual-beam system including one or more electronic controllers and tangible, non-transitory computer readable memory coupled to the one or more electronic controllers containing program code executable by the one or more electronic controllers for performing the automated steps of the process, the process comprising:
   (a) mounting a workpiece lamella having two opposing major lateral sides to a movable sample mount and positioning the movable sample mount within a chamber of the dual beam system;
   (b) under automatic control of at least one of the controllers, directing an ion beam toward the mounted workpiece lamella to mill away a layer of material from one of the major lateral sides of the workpiece;
   (c) under automatic control of at least one of the controllers, tilting the workpiece lamella within the chamber in a pre-designated small-angle tilt series and at each respective tilt orientation of the tilt series acquiring a STEM projection using the SEM of the dual-beam system, the tilt series of sufficient size to create a tomographic reconstruction capable of identifying feature depths;
   (d) after performing (c), automatically with of at least one of the controllers calculating a tomographic reconstruction of the acquired projections;
   (e) automatically with of at least one of the controllers, identifying one or more selected features in the tomographic reconstruction and automatically applying metrology to determine respective depths of the features from both major lateral sides and preparing images of selected ones of the acquired stem projections, or tomographic image projections based on the tomographic reconstruction, with measured depths displayed and identified with boundary lines on images;
   (f) automatically with of at least one of the controllers, measuring a thickness of the workpiece lamella between the lateral sides based on the acquired stem projections or the tomographic reconstruction;
   (g) automatically with of at least one of the controllers, requesting an operator intervention in the process by, on a display associated with the dual beam system: (I) displaying the prepared images with measured depths displayed and identified, (II) displaying the measured thickness of the workpiece lamella; and (III) presenting a limited choice intervention menu on the display with a first option to mill away a layer on the same major lateral side of the workpiece lamella previously milled and a second option to flip the workpiece lamella and then mill away a layer on the opposing major lateral side of the workpiece lamella;
   (h) alerting an operator for the requested intervention;
   (i) receiving an operator choice through limited choice intervention menu;
   (j) based on the operator choice, either flipping the lamella or presenting the previously milled major lateral side of the workpiece lamella toward the ion beam, setting an ion beam strength or desired milling thickness for a subsequent milling layer to be removed, and repeating (b) though (i).

2. The automated workflow process of claim 1, in which the small-angle tilt series includes no more than five projections.

3. The automated workflow process of claim 1, further comprising ion beam milling the workpiece lamella from a larger workpiece under automatic control of the one or more controllers.

4. The automated workflow process of claim 1, in which requesting an operator includes transmitting a notification over a network connected to the dual-beam system.

5. The automated workflow process of claim 1, in which preparing the images in (e) further includes identifying pre-determined features by extracting features in the tomographic reconstruction with image processing, and identifying the extracted features based on expected feature dimension data and automated metrology on the extracted features.

6. The automated workflow process of claim 1 in which acquiring the STEM projections using the SEM of the dual-beam system comprises acquiring High Angle Annular Dark Field (HAADF) STEM images.

7. The automated workflow process of claim 1 in which acquiring the STEM projections using the SEM of the dual-beam system comprises acquiring bright-field (BF) STEM images.

8. The automated workflow process of claim 1, in which requesting an operator includes transmitting a notification over a network connected to the dual-beam system.

9. A process for preparing a site specific ultra-thin sample lamella with a focused ion beam and scanning electron microscope (FIB-SEM) dual-beam system including one or more electronic controllers and tangible, non-transitory computer readable memory coupled to the one or more electronic controllers containing program code executable by the one or more electronic controllers for performing the automated steps of the process, the process comprising:

(a) mounting a workpiece lamella having two opposing major lateral sides to a movable sample mount and positioning the movable sample mount within a chamber of the dual beam system;

(b) under automatic control of at least one of the controllers, directing an ion beam toward the mounted workpiece lamella to mill away a layer of material from one of the major lateral sides of the workpiece;

(c) under automatic control of at least one of the controllers, tilting the workpiece lamella within the chamber in a pre-designated small-angle tilt series and at each respective tilt orientation of the tilt series acquiring a through-surface BSE scan using a BSE detector associated with the SEM of the dual-beam system, the tilt series of sufficient size to create a tomographic reconstruction capable of identifying feature depths;

(d) after performing (c), automatically with of at least one of the controllers calculating a tomographic reconstruction of the acquired projections;

(e) automatically with of at least one of the controllers, identifying one or more selected features in the tomographic reconstruction and applying metrology to determine respective depths of the features from both major lateral sides and preparing tomographic image projections from the reconstruction, with measured depths displayed and identified with boundary lines on images;

(f) automatically with of at least one of the controllers, measuring a thickness of the workpiece lamella between the lateral sides based on the acquired projections or the tomographic reconstruction;

(g) automatically with of at least one of the controllers, requesting an operator intervention in the process by, on a display associated with the dual beam system: (I) displaying the prepared images with measured depths displayed and identified, (II) displaying the measured thickness of the workpiece lamella; and (III) presenting a limited choice intervention menu on the display with a first option to mill away a layer on the same major lateral side of the workpiece lamella previously milled and a second option to flip the workpiece lamella and then mill away a layer on the opposing major lateral side of the workpiece lamella;

(h) alerting an operator for the requested intervention;

(i) receiving an operator choice through limited choice intervention menu;

(j) based on the operator choice, either flipping the lamella or presenting the previously milled major lateral side of the workpiece lamella toward the ion beam, setting an ion beam strength or desired milling thickness for a subsequent milling layer to be removed, and repeating (b) though (i).

10. The automated workflow process of claim 1, in which the small-angle tilt series includes no more than five projections.

11. The automated workflow process of claim 1, further comprising ion beam milling the workpiece lamella from a larger workpiece under automatic control of the one or more controllers.

12. The automated workflow process of claim 1, in which requesting an operator includes transmitting a notification over a network connected to the dual-beam system.

13. The automated workflow process of claim 1, in which preparing the images in (e) further includes identifying pre-determined features by extracting features in the tomographic reconstruction with image processing, and identifying the extracted features based on expected feature dimension data and automated metrology on the extracted features.

14. A process for preparing a site specific ultra-thin sample lamella with a focused ion beam and scanning electron microscope (FIB-SEM) dual-beam system including one or more electronic controllers and tangible, non-transitory computer readable memory coupled to the one or more electronic controllers containing program code executable by the one or more electronic controllers for performing the automated steps of the process, the process comprising:

(a) mounting a workpiece lamella having two opposing major lateral sides to a movable sample mount and positioning the movable sample mount within a chamber of the dual beam system;

(b) under automatic control of at least one of the controllers, directing an ion beam toward the mounted workpiece lamella to mill away a layer of material from one of the major lateral sides of the workpiece;

(c) under automatic control of at least one of the controllers, tilting the workpiece lamella within the chamber in a pre-designated small-angle tilt series and at each respective tilt orientation of the tilt series acquiring a STEM projection using the SEM of the dual-beam system, the tilt series of sufficient size to identify visible feature depths for a selected set of features;

(d) after performing (c), automatically with of at least one of the controllers automatically identifying one or more selected features in the STEM projections, applying metrology to determine respective depths of the features from at least one of the major lateral sides by identifying feature edges, measuring shift magnitudes of the feature edges, and based on the shift magnitudes calculating an estimated depth of the one or more selected features, and then preparing images of selected ones of the acquired stem projections, with measured depths displayed and identified with shift boundary lines on images;

(e) automatically with of at least one of the controllers, measuring a thickness of the workpiece lamella between the lateral sides based on the acquired stem projections;

(f) automatically with of at least one of the controllers, requesting an operator intervention in the process by, on a display associated with the dual beam system: (I) displaying the prepared images with measured depths displayed and identified, (II) displaying the measured thickness of the workpiece lamella; and (III) presenting a limited choice intervention menu on the display with a first option to mill away a layer on the same major lateral side of the workpiece lamella previously milled and a second option to flip the workpiece lamella and then mill away a layer on the opposing major lateral side of the workpiece lamella;

(g) alerting an operator for the requested intervention;

(h) receiving an operator choice through limited choice intervention menu;

(i) based on the operator choice, either flipping the lamella or presenting the previously milled major lateral side of the workpiece lamella toward the ion beam, setting an ion beam strength or desired milling thickness for a subsequent milling layer to be removed, and repeating (b) though (i).

15. The automated workflow process of claim 14, in which the small-angle tilt series includes no more than three projections.

* * * * *